(12) United States Patent
Philippe

(10) Patent No.: US 7,016,652 B2
(45) Date of Patent: Mar. 21, 2006

(54) AUTOMATIC FREQUENCY CONTROL RECEIVER

(75) Inventor: Pascal Philippe, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/519,605

(22) PCT Filed: Jun. 23, 2003

(86) PCT No.: PCT/IB03/02846

§ 371 (c)(1),
(2), (4) Date: Dec. 27, 2004

(87) PCT Pub. No.: WO2004/004121

PCT Pub. Date: Jan. 8, 2004

(65) Prior Publication Data

US 2005/0176395 A1    Aug. 11, 2005

(30) Foreign Application Priority Data

Jun. 28, 2002    (FR) ................................. 02 08131

(51) Int. Cl.
*H04B 17/00* (2006.01)
(52) U.S. Cl. ............ 455/67.11; 455/293; 375/324
(58) Field of Classification Search ............ 455/67.11, 455/21, 130, 293, 258, 312, 337; 375/324, 375/340

See application file for complete search history.

(56) References Cited

U.S. PATENT DOCUMENTS

| | | | |
|---|---|---|---|
| 6,947,490 B1 * | 9/2005 | Edwards et al. | 375/261 |
| 6,950,406 B1 * | 9/2005 | Chen et al. | 370/252 |
| 6,950,483 B1 * | 9/2005 | Chiodini | 375/354 |
| 6,950,626 B1 * | 9/2005 | Suenaga | 455/41.2 |

* cited by examiner

*Primary Examiner*—Charles N. Appiah
*Assistant Examiner*—Nghi H. Ly
(74) *Attorney, Agent, or Firm*—Michael J. Ure

(57) ABSTRACT

The invention relates to a receiver of signals [S] received from a wireless network, said receiver working at a so-called reference oscillation frequency controlled by a so-called reference value [Vref]. Said receiver includes demodulation means [DEMO] for demodulating the received signal [S], means [EST] of estimating a mean value [MV] of the demodulated signal [SD], means [COR] of correcting the mean value [MV] of the demodulated signal [SD] to the reference value [Vref], decision means [DEC] for determining the binary values adopted by the received signal [S]. According to the invention, the estimation means [EST] include first means [ESTA] of fast extraction of a first mean value [MVA] of the demodulated signal [SD] used in decision means [DEC] during a first time period and second means [ESTB] of slow extraction of a second mean value [MVB] of the demodulated signal [SD] used in correction means [COR] and, during a second time period, in decision means [DEC].

7 Claims, 4 Drawing Sheets

AUTOMATIC FREQUENCY CONTROL RECEIVER

Figure 1:
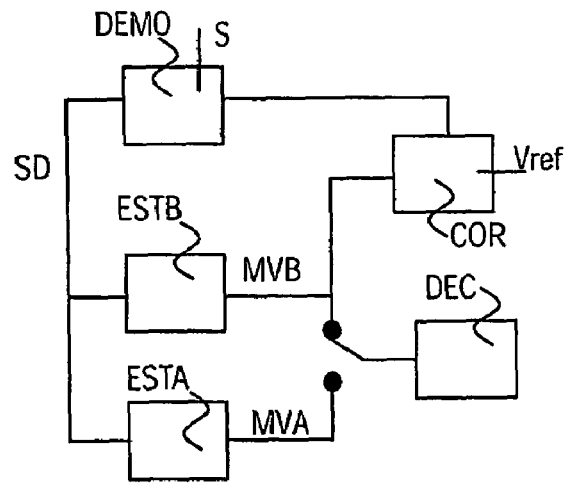

The invention relates to a wireless receiver and in particular the invention relates to the elimination of the frequency difference normally observed on signals received by a wireless receiver between the local frequency of the receiver and that of the received signal. For example, in the BlueTooth standard, the receivers must be capable of dealing with large frequency differences. In a wireless system including a transmitter communicating with the receiver there is generally a difference between the frequency of the transmitter and the frequency at which the local oscillator of the receiver works, referred to as the reference frequency. This difference in frequency is manifested as a difference voltage at the output of the demodulator of the receiver. There already exist methods for estimating the difference voltage from an analysis of the demodulated signal over a certain period of time and then eliminating the difference voltage from the signal, or methods using this voltage difference for adjusting the local oscillator in an automatic frequency control (AFC) loop. Therefore in the prior art wireless receivers working at a so-called reference oscillation frequency controlled by means of a so-called reference value include demodulation means for demodulating the received signal, means of estimating a mean value of the demodulated signal, means of correcting the mean value of the demodulated signal to the reference value, and decision means for determining the binary values taken by the received signal.

The function of correction of the mean value of the demodulated signal by an automatic frequency control loop is therefore known. Within this loop, the estimation means for estimating the voltage difference can, for example, consist of making the demodulated signal pass through a low-pass filter with a narrow passband which eliminates the useful signal and preserves the continuous component.

The invention relates to the following considerations:

The choice of the passband for the low-pass filter is a compromise; with a narrow passband this method is slow for estimating the continuous component, and if the passband is widened in order to increase the speed of the operation, the estimation of the continuous component may be corrupted by components of the signal passing through the filter. The disadvantage of a slow method is that a long portion of the signal is required for estimating the voltage difference before the reception of the useful information, and this gives rise to a loss of time or a loss of precision in the detection for each start of a receiving range. The disadvantage of a more rapid but more corrupted estimation is that errors are introduced into the received signal by the method of eliminating the difference voltage.

One object of the invention is to make it possible to obtain a receiver for signals received over a wireless network and, generally, by receiving ranges, not having the drawbacks disclosed above of the prior art.

For this purpose a wireless receiver in accordance with the introductory paragraph is characterized according to the invention in that the estimation means include first means of rapid extraction of a first mean value of the demodulated signal used in decision means for a first period of time and second means of slow extraction of a second mean value of the demodulated signal used in correction means and, for a second period of time, in decision means.

The two kinds of means of estimating the mean value are complementary and make it possible not to have either a slow system in which a long portion of the signal is required for estimation of the mean value or errors introduced into the signal by a faulty estimation of the mean value of the signal. The signal reception circuit obtained therefore combines slow and fast estimations of the frequency so as to simultaneously achieve a precise correction of the frequency and good sensitivity of the receiver from the start of the receiving range.

In a particular embodiment of the invention, the means of correcting the mean value of the demodulated signal use a frequency correction loop. The principle of automatic frequency control is known for analog data and for digital data.

In an advantageous embodiment of the invention, the first estimation means include means for evaluating the minimum value and the maximum value of the received signal and thus estimating the mean value of the signal at the median value between these two values. Such an estimation is very rapid. However, it suffers from relative imprecision (for example, when a series of consecutive ones or zeros are present in the signal). This estimation could be used for the entire signal but the precision of the decision means could be affected thereby.

Thus, in a preferred embodiment of the invention, the received signal consisting of a synchronization and control part and then a data part, the first period does not exceed the period necessary for the reception of the synchronization and control parts.

The invention can be implemented in any receiver working on a wireless network in which significant frequency differences may arise. BlueTooth, DECT etc technologies and any other technology presenting the characteristics disclosed above are thus concerned.

The principle according to the invention can just as well be used for digital data or analog data.

The invention also relates to an integrated circuit in which there is a receiver according to the invention.

The invention also relates to a method of receiving and processing signals received from a wireless network according to the invention.

The invention will be further described with reference to examples of embodiments shown in the drawings to which, however, the invention is not restricted.

Figure 2:
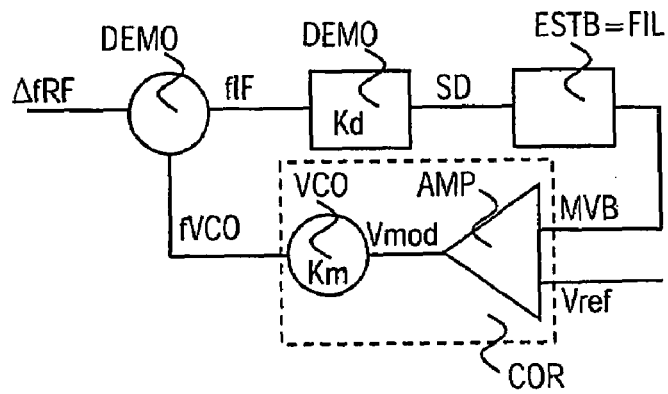
Figure 3:
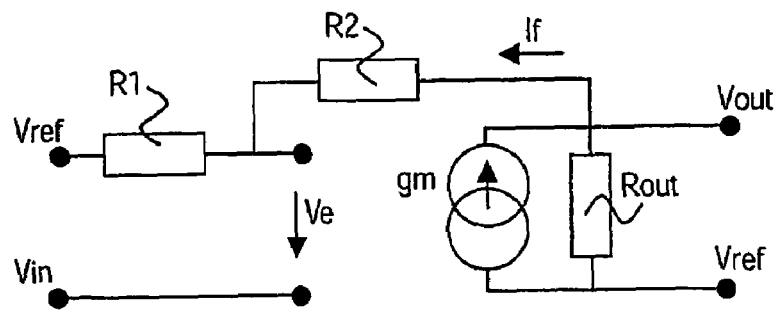
Figure 4:
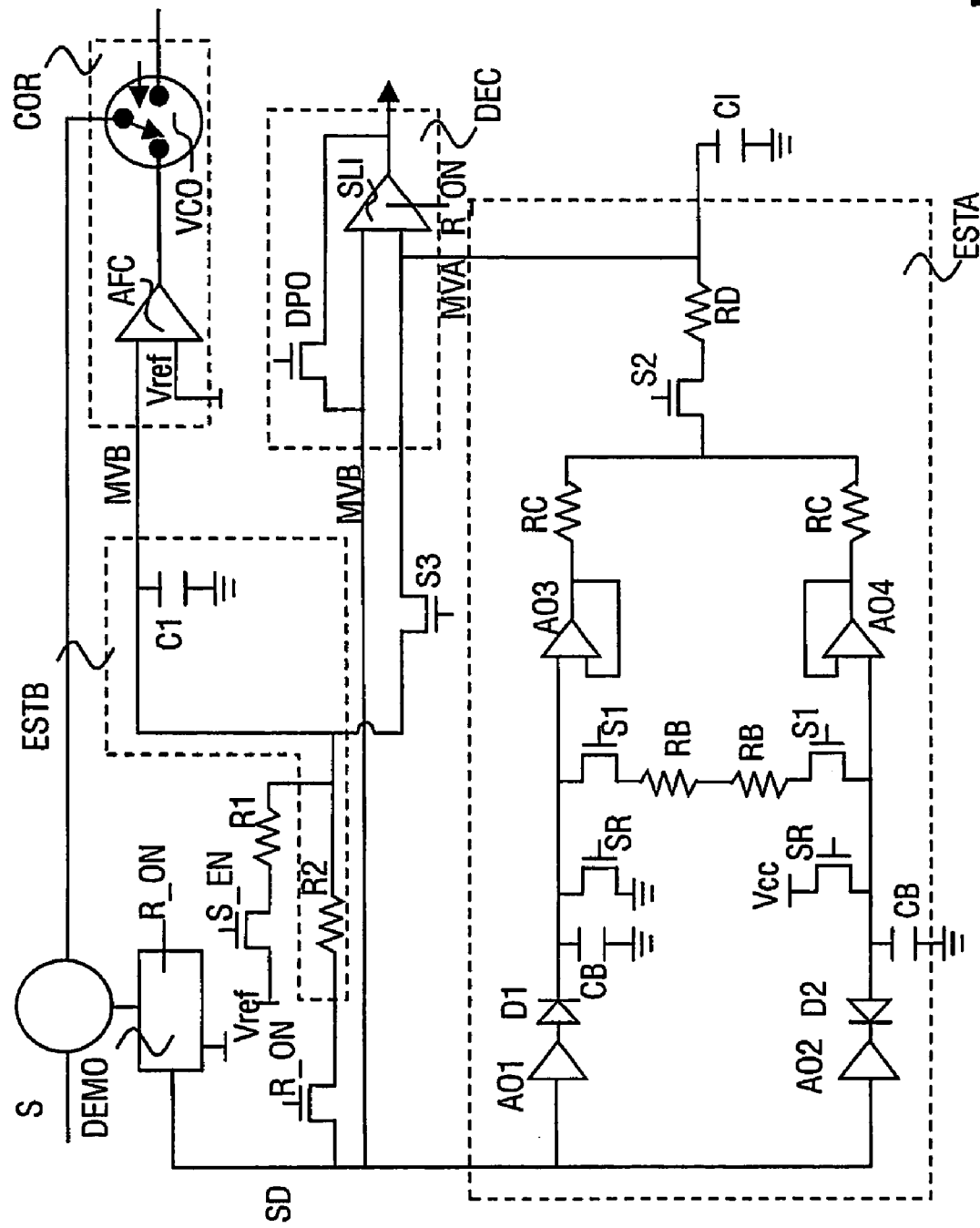
Figure 5:
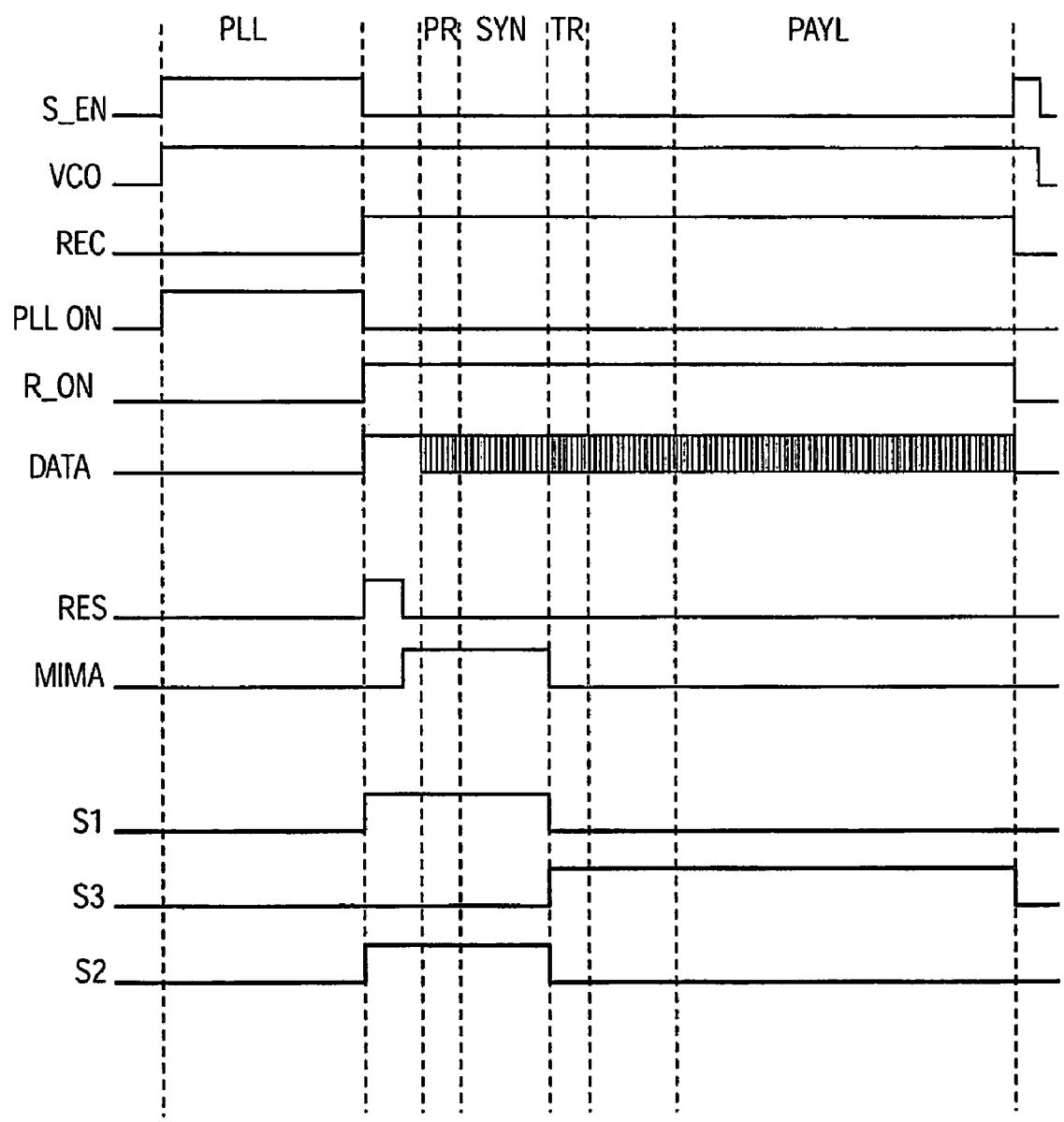
Figure 6:
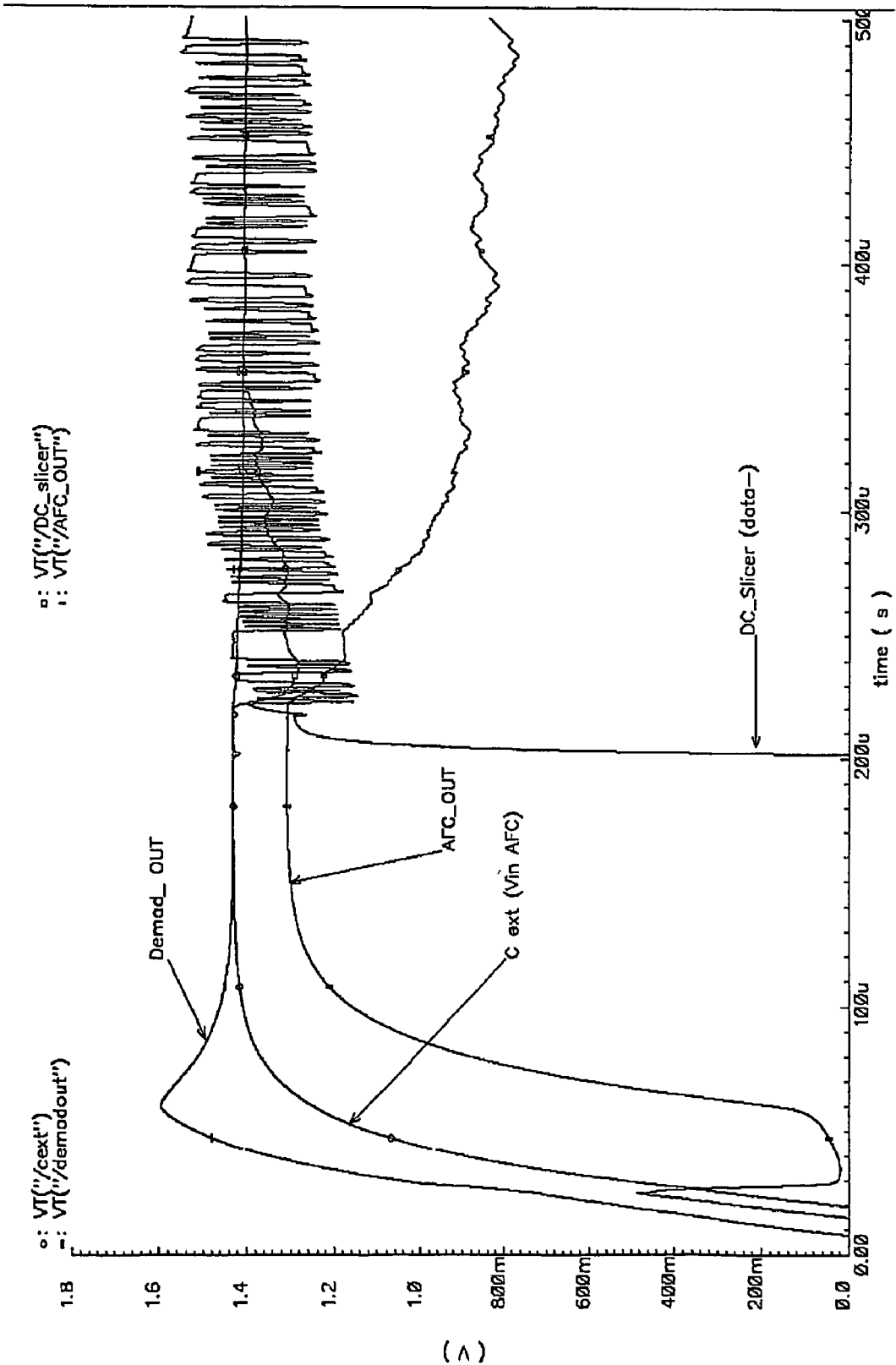

FIG. 1 is a block diagram of a receiver according to the invention,

FIG. 2 is a block diagram of the general principle of an automatic frequency control loop, FIG. 3 is an example of an embodiment for an amplifier implemented within a frequency control loop, FIG. 4 is a functional diagram of a receiver according to the invention according to an advantageous embodiment, FIG. 5 is a time diagram for controlling the various elements of the invention according to a preferred embodiment of the invention, FIG. 6 presents the result of the frequency correction obtained with the implementation of the invention by means of a set of curves representing voltages at various points in the circuit of FIG. 4.

The following remarks relate to the reference signs. Similar entities are designated by identical letters in all the figures. Several similar entities may appear in a single FIGURE. In this case, a number or suffix is added to the reference by letters in order to distinguish similar entities. The number or suffix may be omitted for reasons of convenience. This applies to the description and to the claims.

The description which follows is presented so as to enable a person skilled in the art to implement and make use of the invention. This description is provided in the context of the patent application and its requirements. Various alternatives to the preferred embodiment will be obvious to a person skilled in the art and the generic principles of the invention disclosed here may be applied to other implementations.

Thus the present invention is not deemed to be limited to the embodiment described but rather to have the broadest scope in accordance with the principles and characteristics described below.

FIG. 1 presents a block diagram of a receiver according to the invention. This figure presents means for performing various functions necessary for implementing the invention. These functions are steps in a reception method according to the invention. A receiver according to the invention receives signals S from a wireless network. The receiver includes reception means, not shown, which may for example be an antenna. The receiver works at a so-called reference oscillation frequency, the said oscillation frequency being controlled by means of a so-called reference value Vref. This reference value is generally a voltage. A receiver according to the invention includes demodulation means DEMO for demodulating the received signal S, means EST of estimating the mean value MV of the demodulated signal SD, means COR of correcting the mean value MV of the demodulated signal SD to the reference value Vref, and decision means DEC for determining the binary values adopted by the received signal S. According to the invention, the means EST of estimating the mean value of the received signal include first means ESTA of rapid extraction of a first mean value MVA of the demodulated signal SD used in decision means DEC during a first period of time and second means ESTB of slow extraction of a mean value MVB of the demodulated signal SD used in correction means COR and, during a second period of time, in decision means DEC. The data manipulated by the receiver according to the invention can be digital or analog. Hereinafter, an application of the invention to an analog processing of digital data is presented. A means of estimating the mean value will then be means intended for the processing of analog data. Digital means of estimating digital data can also be used without detriment to the principle of the invention.

In a particular embodiment, and according to what is presented in FIG. 1, the means COR of correcting the mean value MV of the demodulated signal SD are looped onto the demodulator DEMO, thus forming what is commonly referred to as a frequency correction loop. Such a loop is generally known by the term automatic frequency control. FIG. 2 presents a block diagram of the general principle of an automatic frequency control loop. The function of such a frequency control loop is two-fold. It keeps the frequency fIF constant whatever the frequency difference in the received signal. It also compensates for any variations in method and temperature by automatically modifying the frequency fIF to the center frequency of the demodulator. This is achieved by looping the information on the mean frequency fIF onto the local oscillator VCO of the receiver so that the adjustment of the local frequency fVCO thereof takes place automatically. The output signal of the demodulator DEMO is filtered in a low-pass filter FIL in order to extract the mean value of the signal frequency. This filter FIL therefore constitutes means ESTB of slow estimation of the mean value MVB of the demodulated signal SD. An example of such a filter will be given in the description of FIG. 4. The mean value MVB is then compared with a reference value Vref. This creates, for example, an error signal. This information is amplified and applied to a control input of the local oscillator VCO. This results in a change in the frequency of the VCO which tends to cancel out the frequency difference between the signal and the local oscillation.

More precisely, the demodulator is assumed to have a linear response in the following form:

$$SD = Vc - Kd(fIF - fc)$$

where Vc is the output voltage when fIF is equal to fC and Kd is the demodulator gain. A voltage SD is therefore available at the output of the demodulator. The demodulator DEMO is followed by means ESTB of estimating a mean value MVB of the signal SD. These estimation means ESTB advantageously consist of low-pass filtering means FIL as seen above. The mean value MVB obtained is then proportional to the difference in frequency between the frequencies fIF and fc. Next the mean value MVB is compared with a reference value, which is generally a voltage Vref, and amplified by amplification means AMP of gain A and then supplied to the local oscillator of the receiver VCO. This is summarized in the following expression:

$$Vmod = Vref + A(Vin - Vref)$$

The output signal of the amplifier AMP is applied to the local oscillator VCO functioning at the frequency fIF. Thus:

$$fVCO = fref + Km(Vmod - Vref)$$

fref is the frequency when Vmod=Vref and Km is the modulation gain. Each difference in the frequency of the signal therefore modifies the current frequency fIF of the same value but in an opposite direction, and:

$$fIF = fVCO - \Delta fRF$$

Next the response of the system to a variation in the frequency RF may be a difference in the carrier frequency or the modulation itself.

Using the previous equations, the following expression is finally obtained:

$$fIF - fref = \frac{KmAF(Vc - Vref) + KmAFDKd(fc - fref) - \Delta fRF}{1 + KmAFKd}$$

If Vc=Vref, the equation is simplified as:

$$fIF - fref = \frac{KmAFKd(fc - fref) - \Delta fRF}{1 + KmAFKd}$$

Ideally the system is constructed so that fc=fref. In other words, this means that, when fIF=fref, the output voltage Vc=Vref. Because of variations in the method for example, this cannot be the case. When the frequency difference of the signal ΔfRF is zero and if the gain of the loop KmAFKd is fairly large, the equation shows that the loop recenters the frequency fIF towards fIF=fc.

In the case of a frequency difference in the received signal, the loop keeps the frequency fIF close to fc, since the voltage difference is attenuated by a factor 1+KmAFKd.

The loop must compensate for any slow drifts in frequency of the received signal but not react to its modulation. This is achieved by optimization of the loop filter.

By choosing a first-order filter with the transfer function:

$$F(p) = \frac{1}{1+\tau p}$$

For fc=fref, there is obtained:

$$fIF(p) = fref + \frac{1+\tau p}{1+\frac{\tau p}{1+Gloop}} \cdot \frac{\Delta fRF(p)}{1+Gloop}$$

where Gloop=KmAF(0)Kd is the static loop gain.
For a received signal varying rapidly so that $$\frac{\tau p}{1+Gloop} \gg 1,$$

the loop does not react, and the modulation is thus transferred without attenuation in the loop. The loop amplifier must have a high input impedance in order to be sensitive to the voltage present on the loop filter capacitor. Its output controls the tuning of the local oscillator VCO. The amplifier is for example implemented according to FIG. 3 by an amplifier of the transconductance type with returns.

The loop amplifier can be broken down into a gain term Gv and a return gain term β with:

$$Gv = gm \frac{Rout(R1+R2)}{Rout+R1+R2}$$

$$\beta = \frac{R1}{R1+R2}$$

The closed loop gain is:

$$\frac{Vout - Vref}{Vin - Vref} = \frac{Gv}{1+\beta Gv}$$

For example, in the application a gain of approximately 20 is required. As the transconductance is an amplifier with one stage, the gain is not very great, and the gain aimed at is achieved with a fairly low return (Gvβ slightly greater than unity). We have seen here the general functioning of an automatic frequency control loop. In the application to a receiver functioning on a wireless network such as, for example, a BlueTooth receiver, decision means DEC intended to determine whether the signal corresponds to a one (1) or to a zero (0), that is to say to determine the binary value of the received signal, are necessary. The automatic frequency control loop and the said decision means DEC require extraction of the mean value of the signal but have different requirements with regard to this extraction. For the decision means DEC the extraction must above all be rapid during the start of the receiving ranges of the receiver. This start of the receiving ranges generally corresponds to an access code and to signal synchronization and error control signals. On the other hand, for the frequency control loop, a slow extraction is permanently required in order to prevent attenuation or cancellation of the modulation by the frequency control loop. During the start of the receiving range, the extraction of the continuous components is preferably performed by first means of estimating the mean value ESTA. Thus the loop can have a low gain (6 for example). The periods during which the extraction is performed by the various means EST of estimating the mean value MV are chosen according to the characteristics of the signals intended to be received by the receiver. According to FIG. 4, these periods are controlled by control means, which are switches controlled according to a time diagram as for example disclosed in FIG. 5.

FIG. 4 presents an advantageous embodiment of the invention. The means presented in FIG. 1 are found again in more detail and in the context of an analog processing of the data.

According to FIG. 4, the receiver receives the signal S in its demodulator DEMO. The demodulator actuates a switch R_ON in order to put the system in a state of receiving data. Once the demodulation has been performed, the demodulated signal SD is supplied as an input to two kinds of means ESTA and ESTB of estimating the mean value MVA and MVB. The first means ESTA, which are rapid, perform for example an evaluation of the minimum and maximum values of the signal and then take, as a mean value of the demodulated signal SD, the median value between these two values. One implementation of such an evaluation is depicted in FIG. 4. The evaluation of the extremum values of a signal and the calculation of the median value, in particular as described in FIG. 4, are well known from the prior art and will therefore not be described in any further detail here. The second estimation means ESTB consist for example, according to FIG. 4, of a low-pass filter R2C1. The value of the capacitance C1 is chosen from a compromise on the time constant of the RC filter referred to as ESTB. This value is generally high and the capacitor is therefore external. The time constant must be fairly long in order to obtain a good estimation of the mean value of the output signal of the demodulator but fairly short in order to ensure that the level of the filter output is already close to its final value at the end of the access code, when the reference input of the decision means is switched to the output of the slow RC filter. It is remarkable to note that the invention makes it possible to have only one external capacitor in the circuit, which represents a saving in space and manufacturing time for the receiver. This single external capacity is used for the frequency control loop permanently and by intervals of time for the decision means.

The correction means include, in the same way as presented in FIG. 2, an amplifier AFC connected to an input of the local oscillator VCO, the whole being put in a loop with the demodulator DEMO. The decision means DEC include an amplifying element SLI which fixes the value of the output at 1 or at 0 according to the value on two inputs, the first receiving the mean value of the signal coming from one of the estimation means ESTA and ESTB and the second receiving the demodulation signal SD itself. Advantageously, this amplifying element SLI also deactivates the switch signal R_ON activated by the demodulator DEMO when there is no longer any signal to be processed. According to a preferred embodiment, the various switches are actuated according to the time diagrams presented in FIG. 5.

Before the receiving range begins, that is to say, in FIG. 5, on the powering up of the receiver, the external capacitor C1 is precharged to the reference voltage Vref by activating the switch S_EN, which appears on the first line of the time diagram in FIG. 5. When the receiver is powered up, the local oscillator VCO and the loop PLL are also started up. At the start of the receiving range, the detection of a signal is indicated to all the elements of the receiver by the signal R_ON triggered by the demodulator DEMO. The reception REC is then commenced and the data DATA arrive in the form shown for example in FIG. 5. These data, which constitute the received signal, are formed by an access code consisting of several synchronization and error check elements PR, SYN, TR, and then a packet of specific data PAYL, which are the data peculiar to the communication next processed by the receiver. The switch R_ON then makes the external capacitor C1 switch onto the output of the demodulator DEMO for extraction of the mean value MVB of the signal by the second estimation means ESTB. A relatively long time constant is used. In the case of a frequency difference, the mean value of the signal MVB is different from the reference voltage Vref. This information is supplied to an input of the local oscillator VCO in order to correct the frequency of the receiver. This forms what is known as an automatic frequency control loop. During this time, the receiver must determine whether the received bits are zeros or ones. This must be done by comparison with, also, a mean value MV of the signal. The mean value MVB supplied by the estimation means ESTB cannot be used at the start of the receiving range since it does not converge sufficiently quickly towards the actual mean value. Another circuit is therefore used. This circuit includes the estimation means ESTA, which determine the mean value from a detection of peaks. These estimation means ESTA are reinitialized by the activation of the switches SR. Then the detection of the peaks and the evaluation of the values of peaks MIMA are performed during a time constant illustrated in FIG. 5. During this evaluation, the switch S2 is activated whilst S3 is open, so that the mean value of the signal is available at the output of the estimation means ESTA and available at the reference input of the determination element SLI. Next, by switching the switch S2 into the open position and the switch S3 into the closed position, the reference input for the decision means DEC is switched to the mean value MVB measured by the estimation means ESTB. Then the frequency control loop and the decision means use the same mean value of the signal MVB. The time constant is chosen so that the switching takes place before the arrival of the data packet PAYL including the particular data of the communication next processed by the receiver.

A simulation was performed with the values put forward in the table below for the various elements in FIG. 4. This simulation is put forward in FIG. 6.

| R1 | R2 | RB | RC | RD | C1 | CB | CI |
|---|---|---|---|---|---|---|---|
| 0.5K | 50K | 4M | 2K | 100K | 8 nF | 10 pF | 22 pF |

These values are given by way of indication and are not given to the exclusion of other values or range of values. For example, the external capacitance C1 can be increased if, for a specific application, the time constant for acquisition of the data and adjustment of the mean value to the reference value can be increased. Simulations were performed, for example, for a carrier frequency difference of around a hundred kHz (200 kHz in the example in FIG. 6). In such simulations, for example, the actions performed on the time diagram in FIG. 5 are found. The loop PLL and the frequency control loop are activated first. The frequency control loop is initialized with the same reference voltage Vref, for example 1.45 V, as the one which is used for the local oscillator. After the loop PLL has been established at the required frequency, the receiver is activated, in accordance with the diagram in FIG. 5, at 200 $\mu$s. The data arrive at 225 $\mu$s on the curve Demod_OUT. It should be noted in FIG. 6 that these data have a difference with respect to the reference value Vref charged on the external capacitor C1 and depicted on the curve C ext. By virtue of the invention, on the simulation, the effect of the frequency control loop which restore the data and therefore the curve Demod_OUT demodulated around Vref, represented by the curve C ext (Vin AFC), is then observed. The mean voltage used by the decision means depicted on the curve DC_Slicer is first of all supplied by the extraction means by the detection of peaks on the curve Demod_OUT, which operate on the access code and the header packet of the data packet up to approximately 350 $\mu$s according to FIG. 5 and in FIG. 6. At this moment, the frequency control loop has corrected the initial difference. The level of the continuous component MVA extracted by the extraction means by detection of peaks ESTA is close to the mean level indicated by the external capacitance C1 MVB. Then the reference input of the decision means is switched to the external capacitor C1.

Although this invention has been described in accordance with the embodiments presented, a person skilled in the art will immediately recognize that there exist variants to the embodiments presented and that these variants remain in the spirit and within the scope of the present invention. Thus many modifications can be made by a person skilled in the art without for all that being excluded from the spirit and scope defined by the following claims.

The invention claimed is:

1. A receiver for signals received on a wireless network, said receiver working at a so-called reference oscillation frequency, said oscillation frequency being controlled by means of a so-called reference value, including:
   demodulation means for demodulating the received signal,
   means of estimating a mean value of the demodulated signal,
   means of correcting the mean value of the demodulated signal to the reference value,
   decision means for determining the binary values adopted by the received signal,
   characterized in that the estimation means include first means of rapid extraction of a first mean value of the demodulated signal used in decision means during a first period of time and second means of slow extraction of a second mean value of the demodulated signal used in correction means and, during a second period of time, in decision means.

2. A receiver as claimed in claim 1, characterized in that the means of correcting the mean value of the demodulated signal use a frequency correction loop.

3. A receiver as claimed in claim 1, characterized in that the second extraction means include low-pass filtration means for extracting the mean frequency of the signal.

4. A receiver as claimed in claim 1, characterized in that the first estimation means include means for evaluating the minimum and maximum of the received signal and estimating the mean value of the signal at the median value of the minimum and maximum.

5. A receiver as claimed in claim 1, characterized in that, the received signal consisting of a synchronization and control part and then a data part, the first period does not exceed the duration necessary for receiving the synchronization and control parts.

6. An integrated circuit including a receiver as claimed in claim 1.

7. A method of receiving and processing signals received on a wireless network, including the steps of
- demodulation for demodulating the received signal,
- estimation of the mean value of the demodulated signal,
- correction of the mean value of the demodulated signal to the reference value,
- decision for determining the binary value taken by the received signal, characterized in that the estimation step includes a rapid substep of extracting a first mean value of the demodulated signal used in the decision step during a first period of time and a second substep of slow extraction of a second mean value of the demodulated signal used in the correction step and, during a second period of time, in the decision step.

\* \* \* \* \*